(12) United States Patent  
Iihola et al.

(10) Patent No.: US 8,659,134 B2  
(45) Date of Patent: Feb. 25, 2014

(54) MULTI-CHIP PACKAGE AND MANUFACTURING METHOD

(75) Inventors: Antti Iihola, Helsinki (FI); Risto Tuominen, Espoo (FI)

(73) Assignee: GE Embedded Electronics Oy, Helsinki (FI)

( * ) Notice: Subject to any disclaimer, the term of this patent is extended or adjusted under 35 U.S.C. 154(b) by 612 days.

(21) Appl. No.: 12/506,519

(22) Filed: Jul. 21, 2009

(65) Prior Publication Data

US 2010/0052129 A1  Mar. 4, 2010

(30) Foreign Application Priority Data

Jul. 22, 2008 (FI) .................................. 20085739

(51) Int. Cl.  
*H01L 23/02* (2006.01)

(52) U.S. Cl.  
USPC .......................................... 257/678; 257/690

(58) Field of Classification Search  
USPC ................................................. 257/678–733  
See application file for complete search history.

(56) References Cited

U.S. PATENT DOCUMENTS

| | | | |
|---|---|---|---|
| 6,339,254 B1 | 1/2002 | Venkateshwaran et al. | |
| 7,198,986 B2 * | 4/2007 | Sunohara .................... | 438/109 |
| 2002/0045290 A1 | 4/2002 | Ball | |
| 2002/0096755 A1 | 7/2002 | Fukui et al. | |
| 2002/0139577 A1 | 10/2002 | Miller | |
| 2005/0006142 A1 | 1/2005 | Ishimaru et al. | |
| 2005/0173783 A1 | 8/2005 | Chow et al. | |
| 2007/0075422 A1 | 4/2007 | Fujii et al. | |
| 2008/0157316 A1* | 7/2008 | Yang .............................. | 257/685 |
| 2008/0174023 A1* | 7/2008 | Park .............................. | 257/773 |
| 2008/0251943 A1* | 10/2008 | Corisis et al. ................. | 257/778 |
| 2010/0142170 A1* | 6/2010 | Kim et al. ..................... | 361/762 |

FOREIGN PATENT DOCUMENTS

| | | |
|---|---|---|
| EP | 1 519 415 A2 | 3/2005 |
| JP | 10-84076 A | 3/1998 |

* cited by examiner

*Primary Examiner* — Telly Green  
(74) *Attorney, Agent, or Firm* — Birch, Stewart, Kolasch & Birch, LLP (57) ABSTRACT

Manufacturing method and a multi-chip package, which comprises a conductor pattern (1) and insulation (2), and, inside the insulation, a first component (3), the contact terminals (4) of which face towards the conductor pattern (1) and are conductively connected to the conductor pattern (1). The multi-chip package also comprises inside the insulation (2) a second semiconductor chip (13), the contact terminals (14) of which face towards the same conductor pattern (1) and are conductively connected through contact elements (15) to this conductor pattern (1). The semiconductor chips are located in such a way that the first semiconductor chip (3) is located between the second semiconductor chip (13) and the conductor pattern (1).

19 Claims, 11 Drawing Sheets

| | | | |
|---|---|---|---|
| ▨ =Top component | | ■ =Top component contact area | |
| ▨ =Bottom component | | ▨ =Bottom component contact area | |
| ⌐ ⌐ =Package outline | | | |
| ☐ =Discrete component | | | |

▨ =Top component  ■ =Top component contact area
▨ =Bottom component  ▨ =Bottom component contact area
⌐ ¬ =Package outline
□ =Discrete component

MULTI-CHIP PACKAGE AND MANUFACTURING METHOD

The invention relates to a component package for more than one component and a component-package manufacturing method.

One particular application of the component packaging to which the invention relates is the packaging of semiconductor components. However, the component being packaged can also be a passive component, for example, a ceramic-based passive component. Generally, the component is any component whatever that is suitable for packaging.

The prior art discloses several different kinds of component packages, i.e. multi-chip packages, containing several semiconductor components. In the present document, the term multi-chip package also refers to component packages, in which the component being packaged is a component or chip other than a semiconductor chip, though semiconductor chips are one very important application. The placing of several components in a single package seeks to make the structure smaller than one that contains corresponding components packaged separately. Thus, one objective in multi-chip packages is a high component density.

When very small and high-quality solutions have been sought in component packages, so-called 3D packaging has been used. One of the oldest 3D packaging solutions has been to stack simple TSOP, QFP, or CSP-type packages on top of each other. A suitable intermediate board, in which suitable vias and contacts have been made, is placed between packages that are stacked on top of each other. Another alternative has been to use a substrate, in which contacts are made for each package to be assembled, for example, with the aid of wire connections.

So-called SiP-technique (System-in-Package), for its part, comprises chip-level packages stacked on top of each other, the PoP and PiP techniques (Package-on-Package and Package-in-Package), as well as multi-chip modules, (MCM/MCP). In most existing multi-chip packages, the electrical connection of the components to the package structure are made with the aid of wire bonding. Other alternatives are flip-chip (FC) techniques and soldered contacts.

Solutions using wire bonding have many drawbacks when attempting to make solutions of a small size. Wire connections unavoidably take up space and otherwise restrict the design of the geometry of the package. In the PoP and PiP techniques, on the other hand, two or more packages are set on top of each other, or integrated inside each other. In these solutions, wire connections are typically required to make the connections between the packages. In addition, in the PoP and PiP techniques costs become relatively high, due to the multi-stage packaging process.

Problems also arise in the flip-chip technique, if it is wished to attach two components on top of each other on the same substrate. The placing and connection of the upper component will then be very difficult. Patent application publication US 2002/0045290 discloses one such solution, in which the lower components can certainly be attached to the substrate using the flip-chip technique, but the connections of the upper components must be made using wire-connection technology, so that the necessary space for the connector wires and for connecting them must be reserved around the components.

In patent application publication US 2005/0006142, an attempt is made to create a thin solution by placing two chips on top of each other, in such a way that the electrical contacts of the chips are made in two different conductor patterns, between which the chips are located. In the case of some applications, such a solution has the problem that the electrical contact between the chips of top of each other must be designed to run through two separate conductor-pattern layers and a via connecting them. The electrical properties of such a connection are not optimal, particularly when transmitting radio-frequency signals.

Thus, features that make the solutions non-optimal in many applications are associated with known multi-chip packages.

The present invention is intended to develop further the technology relating to multi-chip packages and for this purpose create a new package construction and method for manufacturing it.

The invention is based on having not only an inverted lower component but also on attaching at least one upper component to the package structure when inverted, i.e. in such a way that the contact terminals on the surface of the component face towards the conductor pattern, to which the contact terminals are connected electrically with the aid of contact elements.

According to an aspect of the invention there is provided a multi-chip package, which comprises conductor pattern and insulation, and inside the insulation, a first and second component of which contact terminals face towards the same conductor pattern and are connected conductively to this conductor pattern. The first component is at least partly located between the second component and a conductor pattern and at least the contact terminals of the second component are connected to the conductor pattern with the aid of contact elements.

According to another aspect of the invention, a method is created for manufacturing a multi-chip package, which multi-chip package comprises a conductor pattern, insulation, and a first and second component inside the insulation. According to the method, the first and second components are positioned in such a way that the contact terminals of the components face towards the same conductor pattern and at least part of the first component remains between the second component and this conductor pattern. In addition, the contact terminals of the first and second component are connected conductively to the same conductor pattern.

The term conductor pattern thus refers to a conductor pattern formed by one planar conductor layer of the package or circuit board. In multi-layer packages or circuit boards, there are several such conductor patterns in layers, in such a way that, in the thickness direction of the package or circuit board, the conductor patterns are separated from each other by an insulator layer.

The invention provides an opportunity to implement many interesting embodiments, which can offer advantages in at least some applications.

For example, an embodiment becomes possible, in which as in the case of the lower component the contact elements required for the connection of the upper chip too are manufactured in such a way that the contact elements extend between the contact terminals and the conductor pattern mainly only in the thickness direction of the package. Thus, the contact elements can be made substantially shorter than in the wire-connection technique, in which the connection wires also extend to a significant extent in the width direction of the package. The shorter contact element takes up less space and, in some embodiments, can provide better electrical properties for the connection.

As will already have become apparent above, the term thickness direction of the package refers to the direction that is at right angles to surface of the conductor pattern and against the surfaces of the contact terminals of the components. On the other hand, the direction that is at right angles to the thickness direction is referred to as the width direction of the package. The main surfaces of the components are thus surfaces parallel to the width direction of the package and the conductors of the conductor pattern are intended to conduct electricity in the width direction of the package.

Thus, if desired, embodiments can also be used to allow the manufacture of multi-chip packages with a very high packaging density.

With the aid of an embodiment, it also possible to manufacture contacts in both the first and the second semiconductor chip, in such a way that the contact structure, such as a contact element, forms a unified metal structure in the thickness direction of the package, which is metallurgically compatible with both the contact terminal of the semiconductor chip and the material of the conductor pattern of the package. In one embodiment, the contact structure is mainly formed of copper, in such a way that a first layer of copper is grown by a chemical growing method and additional copper is grown on top of this by an electrochemical growing method.

In one embodiment, the contacts of both the first semiconductor chip and the second semiconductor chip are manufactured using the same method. Thus, contact elements possessing a similar or corresponding structure are manufactured on the surfaces of the contact terminals of both semiconductor chips, with, however, the difference that the contact elements connected to the contact terminals of the first semiconductor chip are generally lower and narrower.

Of course, with the aid of embodiments, the multi-chip package can also include more than two semiconductor chips. The semiconductor chips can be located in two or more layers. One layer can thus contain more than one component.

In one embodiment, the components are in two layers, in such a way that there is more than one component between the upper component and the conductor pattern.

In one embodiment, the components are in three or more layers.

In one embodiment, the lower component is entirely between the upper component and the conductor-pattern.

In another embodiment, only part of the lower component is between the upper component and the conductor pattern.

In one embodiment, the upper component is also connected to a conductor pattern on the opposite side. The component is thus connected to a conductor pattern in the direction of both of its principal surfaces.

In one embodiment, the lower component does not extend between the contact areas of the upper component and the conductor pattern. In a special case of such an embodiment, the component package is equal in size in the width direction to the largest component located in the package.

In another embodiment, the lower component extends between the conductor pattern and the contact area of at least one upper component, in which case a perforated layer is manufactured between the lower and upper components, for the manufacture of contacts.

If desired, it is possible to use embodiments to manufacture a multi-chip package, the size of which is only slightly larger than that of the largest semiconductor chip contained in the package. Thus, it is possible to manufacture a real chip-level package that contains two or more semiconductor chips.

With the aid of some embodiments, it is also possible to improve the signal quality, especially compared to constructions using the wire-connection technique. A better signal quality can be achieved on the one hand thanks to the shorter conductors. On the other hand, the quality and reliability of the contact itself can also be improved, compared to the wire-connection technique. With the aid of embodiments, it is also possible to achieve a low parasitic inductance for the connection and for the entire multi-chip package, because the conductor runs between the chips can be designed to be short.

Further, with the aid of embodiments, passive components can be included or integrated in a multi-chip package.

In the following the invention is examined with the aid of examples and with reference to the accompanying drawings.

In FIGS. 7A-7I, the direction of view is from bottom side of the modules. That is, the bottom component is closer to the conductive layer 1.

Figure 1:
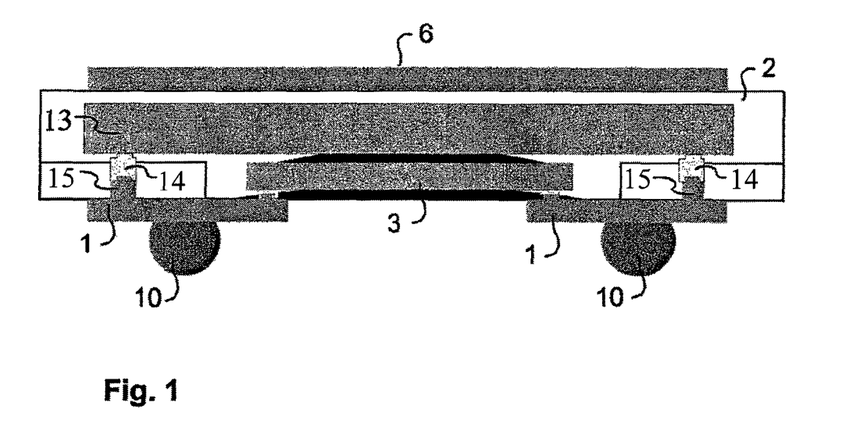
FIG. 1 presents a cross-section of a multi-chip package according to one embodiment.

FIG. 1 presents a cross-section of a multi-chip package. The package of FIG. 1 comprises a first conductor pattern 1 and a second conductor pattern 6, as well as insulation 2 between them. In the embodiment of FIG. 1, a second conductor pattern 6 forms a unified conductor plane or conductor plate on the rear surface of the package. Such a conductor plane can be exploited, for example, to reduce the electromagnetic interference effect between the semiconductor chips and the environment of the package.

The multi-chip package of FIG. 1 comprises a first semiconductor chip 3, the contact terminals 4 of which are connected conductively to the conductor pattern 1, located inside insulation 2. The semiconductor chip 3 is a so-called bumpless type of component, so that the contact terminals 4 are contact pads made in the semiconductor factory on the surface of the semiconductor chip 3. Alternatively, the contact terminals can be formed from contact bumps grown on top of the contact pads, or from purely the base metallurgical layer. In this case, the term base metallurgical layer refers to metal coatings thinner than a normal bump, which can also be used as a base layer in a bump-manufacturing process. The semiconductor chip 3 is positioned in such a way that the contact terminals face towards the conductor pattern 1, i.e. they are on that surface of the semiconductor chip 3 that is on the conductor pattern 1 side.

The contact terminals of the semiconductor chip 3 are connected to the conductor pattern either directly, or anisotropically by means of a conductive layer. Direct connection can be implemented, for example, by the ultrasound bonding or thermo-compression methods. The contact terminals can be structural components made from any conductor material whatever suitable for the purpose. Such structural components can be made from, for example, conductor paste, conductive adhesive, some other conductive polymer, or metal. Generally, however, the best contacts are obtained by manufacturing the contact elements by growing them from metal using a chemical and/or chemical method.

The multi-chip package of FIG. 1 also comprises a second semiconductor chip 13 located inside the insulation 2. The contact terminals 14 of the second semiconductor chip 13 face towards the conductor pattern 1. The contact terminals 14 of the second semiconductor chip 13 are connected conductively to the same conductor pattern 1 as the contact terminals of the first semiconductor chip 3. In the embodiment of FIG. 1, the second semiconductor chip 13 is a so-called bumped component, i.e. a component, on the surface of the contact pads of which contact bumps are grown before the component is attached to the package structure.

The second semiconductor chip 13 is located on top of the first semiconductor chip 3, i.e. the first semiconductor chip 3 is located between the second semiconductor chip 13 and the conductor pattern 1. For this reason, the contact terminals 14 of the second semiconductor chin 13 remain at distance from the conductor pattern 1 and the conductive connection is formed by means of contact elements 15. As described above, the contact elements 15 too can be structural components manufactured from any conductor material whatever suitable for the purpose. However, the contact elements 15 are preferably manufactured by growing at least one metal on the surfaces of the contact terminals 14 using a chemical and/or electrochemical method.

In addition, the multi-chip package of FIG. 1 comprises contact balls 10, for creating external contacts. These contact balls are made directly on the surface of the conductor pattern 1.

Figure 2:
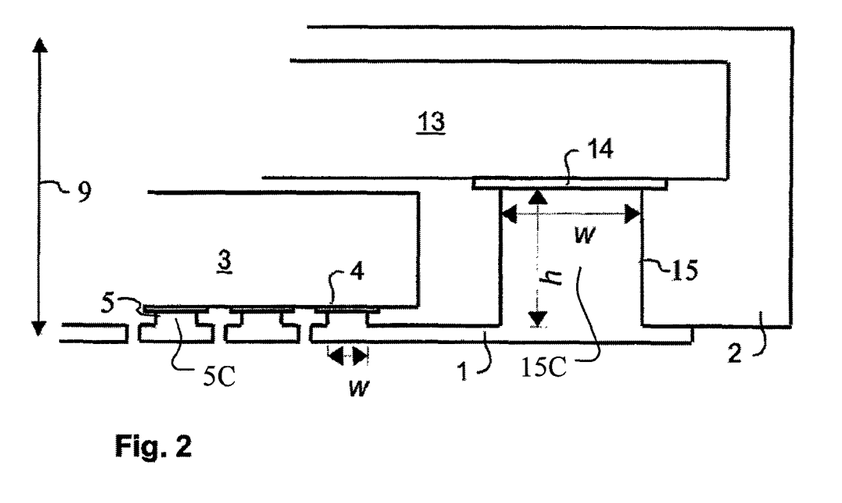
FIG. 2 presents a cross-section of part of a multi-chip package according to a second embodiment.

FIG. 2 presents a cross-section of part of a multi-chip package like the multi-chip package of FIG. 1. However, unlike the package of FIG. 1, in the package of FIG. 2 the second semiconductor chip 13 too is bumpless. In other words, in the package of FIG. 2 both the contact terminals 4 of the first semiconductor chip 3 and the contact terminals 14 of the second semiconductor chip 13 are formed of contact pads on the surface of the semiconductor chip. FIG. 2 also presents the insulation 2 and the first contact elements 5 and the second contact elements 15, which penetrate the insulation 2 between the contact terminals 4 and 14 and the conductor pattern 1. In addition, the figure shows an arrow 9 indicating the thickness direction of the multi-chip package.

In the embodiment of FIG. 2, the width w of the first contact elements 5 is about 30 micrometers and the height h about 10 micrometers. The height h is in this case measured in the thickness direction 9 of the multi-chip package and corresponds to the distance between the surface of the contact terminal 4 and the surface of the conductor pattern 1, i.e. at the same time it is also the distance between the surface of the contact terminal 4 and the surface of the insulation 2. The width $w_{max}$ is the greatest width of the contact element in a direction at right angles to the height. Generally, the width $w_{max}$ is less than or equal to the corresponding contact terminal 4. The width $w_{min}$ on the other hand is the smallest width of the contact element in a direction at right angles to the height. Generally, the height h is less than or equal to the width $w_{min}$. Typical numerical values for the first contact elements 5 are width $w_{max}$ in the range 10-80 micrometers, usually in the range 20-50 micrometers and height h in the range 0-30 micrometers, usually in the range 2-10 micrometers.

In the embodiment of FIG. 2, the widths $w_{min}$ and $w_{max}$ of the second contact elements 15 are about 100 micrometers while the height h is about 100 micrometers. The height h, the width $w_{min}$, the width $w_{max}$ and the ratios between them are defined correspondingly to the above description in connection with the second contact elements 5. Typical numerical values for the second contact elements 15 are widths $w_{min}$ and $w_{max}$ in the range 10-200 micrometers, usually in the range 50-120 micrometers, and height h in the range 10-200 micrometers, usually in the range 50-120 micrometers.

The widths $w_{min}$ and $w_{max}$ can differ significantly from each other to correspond to the shape of the contact elements. In special cases, the cross-section of the contact element is circular, in which case $w_{min}$ will be essentially equal to $w_{max}$.

In the following, the multi-chip packages is described in greater detail, with reference to details and to the embodiments of FIG. 1 and FIG. 2.

The ratio, already referred to above, between the width $w_{min}$ and the height h of the contact element 5, 15 can be presented as follows in the form of an equation:

$$\frac{w_{min}}{h} \geq k$$

in which
h=the height of the contact element in a direction at right angles to the surface of the contact terminal and corresponds to the distance between the surface of the contact terminal 4, 14 and the surface of the conductor pattern 1, i.e. also to the distance between the surface of the contact terminal 4, 14 and the surface of the insulation 2,
$w_{min}$=smallest width $w_{min}$ of the contact element in the direction of the surface of the contact terminal, and
k=a constant, which is at least 0.5 and preferably at least 1.

In the embodiments of the figures, the contact elements 5, 15 extend between the contact terminals 4, 14 and the conductor pattern 1, mainly only in the thickness direction 9 of the multi-chip package. Thus, the contact elements 5, 15 do not extend in the width direction of the multi-chip package substantially outside the contact terminals 4, 14. This can also be stated by saying that the projection of each contact element 5, 15 on a plane running through the surface of the conductor pattern 1 remains at least substantially inside the projection of the corresponding contact terminal 4, 14. In the embodiment of FIG. 2, the contact element 5, 15 is manufactured to be narrower, in such a way that the projection of each contact element 5, 15 on a plane running through the surface of the conductor pattern 1 is entirely inside the projection of the corresponding contact terminal 4, 14. Such contact elements 5, 15 can be manufactured to be short, so that they take up only a little space. The embodiment differ essentially from the known contacting manners using wire bonding, in which the connector wires are run over long distances in the width direction of the package.

Combining the short contact elements 5, 15 and the first and second semiconductor chip 3, 13 in the same conductor pattern 1 also permits very short conductor runs between the semiconductor chips 3, 13. Such a conductor run, which runs from the surface 4 of the contact terminal of the first semiconductor chip through the conductor pattern 1 and the contact element 5, 15 to the surface of the contact terminal 14 of the second semiconductor chip, can have a length of, for example, less than 500 micrometers. The length of the conductor run can even be designed in such a way that it is less than 250 micrometers.

The actual contact elements 5, 15 can each consist of a cylindrical conductor piece. Such a conductor piece can be manufactured by, for example, filling an opening made in the insulation 2 with a conductor material. In one embodiment, each cylindrical conductor piece contains a metal core 5C, 15C, which is metallurgically of a single piece with the conductor pattern 1 (see FIG. 2). This is implemented in such a way that, when the contact elements 5, 15 are manufactured, metal is grown in both the conductor piece forming the contact element 5, 15 and in the conductor pattern, so that the metal core 5C 15C of the contact element 5, 15 joins continuously and without an interface to the material of the conductor pattern 1.

Generally, the multi-chip package is sought to be designed in such a way that the heights h of the contact elements 5, 15 are less than 500 micrometers and preferably at most 200 micrometers, even as little as less than 100 micrometers. The height h of the contact elements 5 of the first semiconductor chip is preferably less than 25 micrometers, even as little as less than 5 micrometers.

The embodiments of FIGS. 1 and 2 can be exploited, for example, as the separate multi-chip packages depicted in FIG. 1, or alternatively in such a way that the multi-chip packages is manufactured as part of a more extensive circuit module. The multi-chip package can thus also be a fixed part of a multi-layer circuit board, in such a way that the conductor pattern 1 joins one of the conductor-pattern layers of the multi-layer circuit board and the insulation 2 is part of at least one of the insulating layers of the multi-layer circuit board.

A multi-chip package according to the embodiments of FIGS. 1 and 2, or some other corresponding multi-chip package can be manufactured in such a way that a package blank is manufactured, which comprises a thin insulator or conductor board or a layered board, which comprises insulator and conductor layers. The method can be planned in such a way that part of the material of the conductor board or conductor layer will form the conductor pattern 1 or part of the conductor pattern 1. The possible insulator board or insulator layer of the package blank too can be designed to be utilized as part of the multi-chip package. In the method, the first semiconductor chip 3 is attached to the package blank, in such a way that the contact terminals 4 of the first semiconductor chip 3 face towards the board of the package blank. The second semiconductor chip 13 is attached on ton of the first semiconductor chip 3 in a corresponding manner. It is also possible to proceed in such a way that the first and second semiconductor chips 3, 13 are first of all attached on top of each other and then the totality that they form is attached to the package blank.

After this, additional insulating material and, if desired, conductor layers can be connected to the package blank using, for example, laminating technology. It is then also possible to manufacture the insulation 2, which encloses the semiconductor chips 3, 13 inside it. As stated above, part of the insulation 2 can, of course, be brought to the structure already as part of the package blank.

If the package blank contains a conductor board or conductor layer, the contact terminals 4, 14 of the semiconductor chips 3, 13 can be connected conductively to this conductor material, for example, in this stage. After connecting, the conductor material is patterned to form a conductor pattern 1. Of course, the conductor material can be patterned to form a conductor pattern also before the manufacture of the conductor connection. The actual connection can be performed, for example, in such a way that contact holes 7, 17 are opened in the insulation 2 at the locations of the contact terminals 4, 14 and contact elements, which extend to make a contact with the material of the conductor pattern 1, are manufactured from a conductor material on the surfaces of the contact terminals 4, 14 in the contact holes 7, 17. If the package blank does not contain conductor material for the conductor patterns 1, the material of the conductor patterns can be added or grown on the surface of the package blank, for example, in the same stage and using the same method, by which the conductor material of the contact elements 5, 15 is brought to the structure. One good method for manufacturing the contact elements 5, 15 and, if necessary, the conductor pattern 1 is to grow at least one metal in the structure, using a chemical and/or electrochemical growing method.

The manufacture of a multi-chip package can also be performed as part of the manufacturing method of a multi-layer circuit board, in which case the multi-chip package is integrated to form part of the multi-layer circuit board. Embodiments of such manufacturing methods are described in the following, but the following methods are also equally suitable for the manufacture of separate multi-chip packages. Separate multi-chip packages can also be manufactured in such a way that, as in the following embodiments, larger panels are made, which comprise several multi-chip packages, and the multi-chip packages are cut from the finished panels.

Figure 3A:
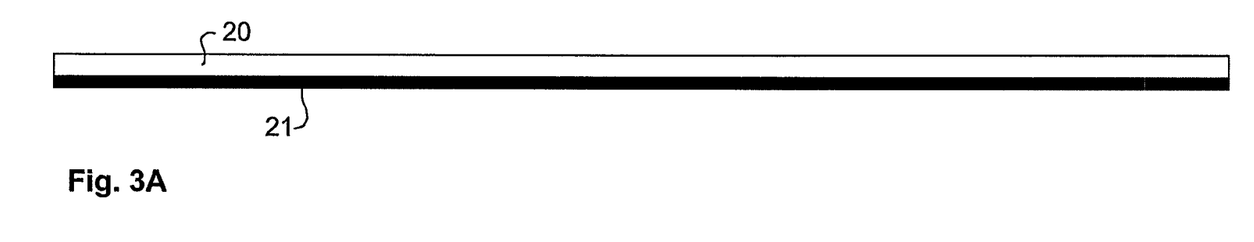
FIGS. 3A-3J present intermediate stages in a manufacturing method according to one embodiment.
Figure 3B:
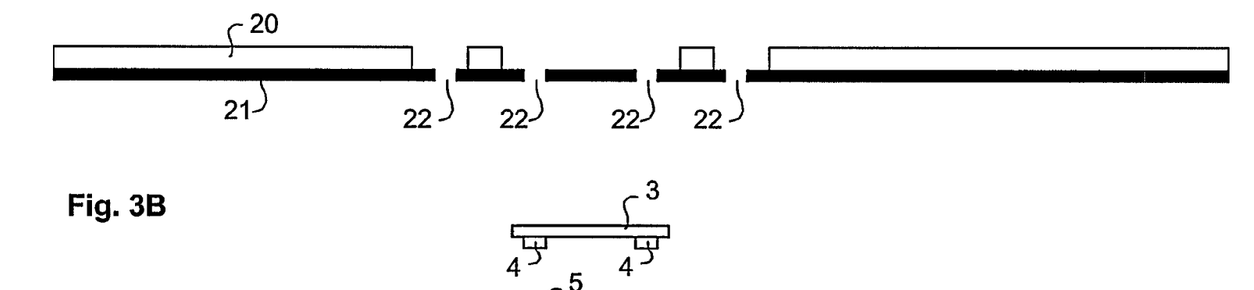
Figure 3C:
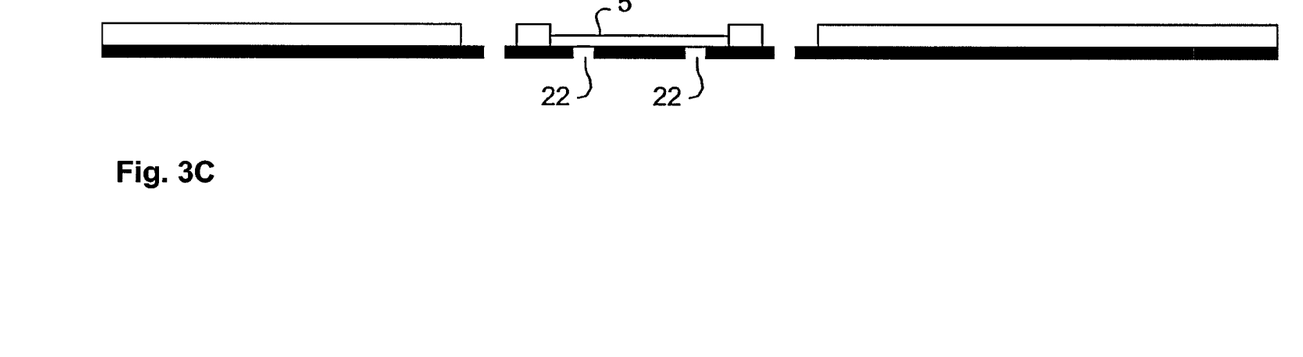
Figure 3D:
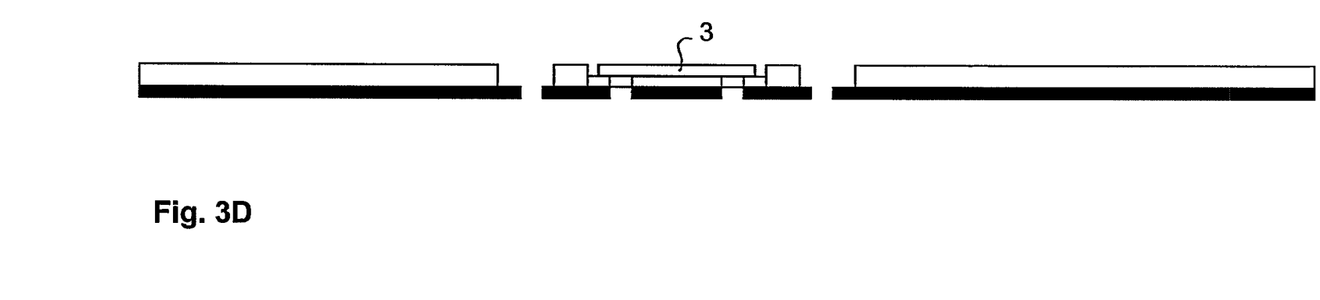

FIGS. 3A-3J present one possible manufacturing method. In the method, manufacture is started from a blank shown in FIG. 3A, which comprises an insulator layer 20 and a conductor layer 21. According to FIG. 3B, contact openings 22 are made in the blank at the locations of the future contact elements. In addition, the insulator layer 20 is removed out of the road of the components and their contact terminals. In FIG. 3C, the first semiconductor chip 3 is attached to the blank with the aid of a layer of adhesive 23, in such a way that the contact terminals of the first semiconductor chip 3 are aligned with the corresponding contact openings 22. After this, the structure shown in FIG. 3D is achieved.

Figure 3E:
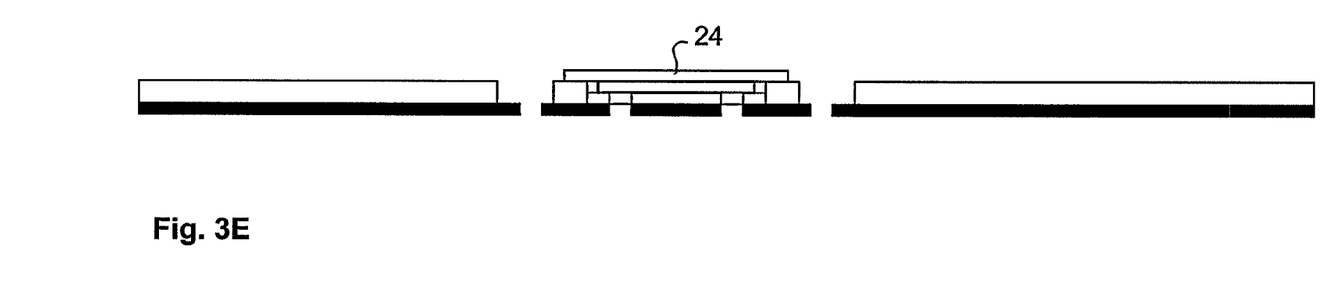
Figure 3F:
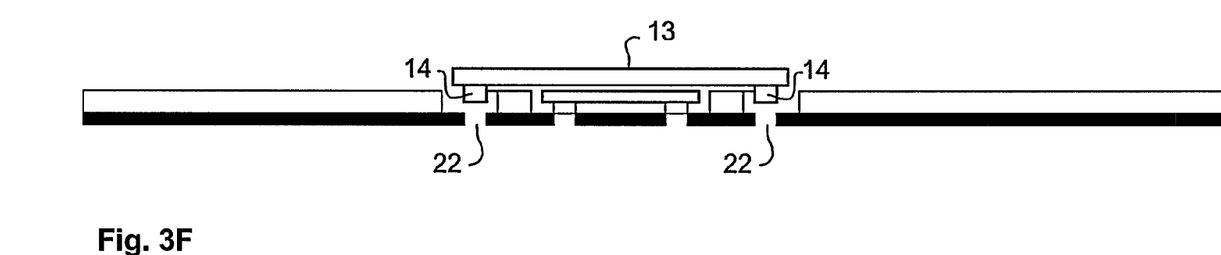

According to FIG. 3E, a new layer of adhesive 24, which covers the rear surface of the first semiconductor chip 3, is added to the blank. According to FIG. 3F, the contact-terminal-side surface of the second semiconductor chip 13 is pressed against this layer of adhesive 24 and thus the second semiconductor chip 13 is attached to the blank. The contact terminals 14 are aligned with the corresponding contact openings 22.

Figure 3G:
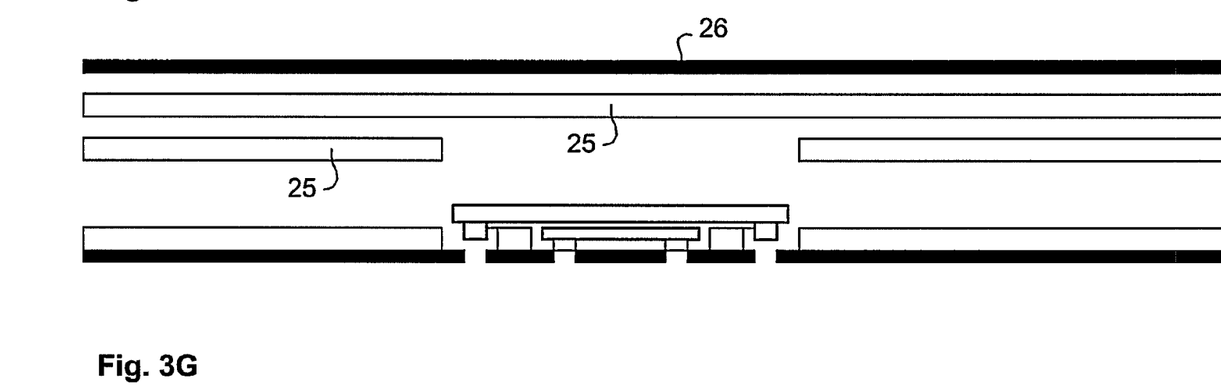
Figure 3H:
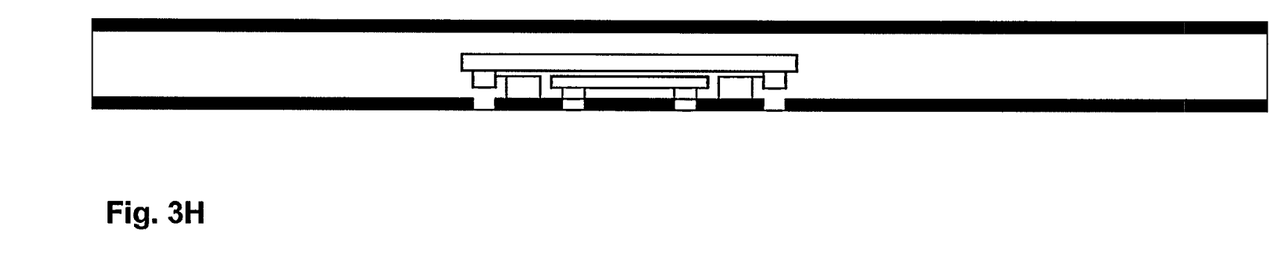

In the method stage shown in FIG. 3G, addition insulating-material boards 25, which come together with the insulator layer 20 to form the insulation 2 of the multi-chip package or circuit board, are laminated onto the blank. A conductor film 26, from which, for example, the second conductor pattern 6 shown in FIG. 1 can be formed, is at the same time laminated onto the opposite surface. FIG. 3H shows the blank after the lamination stage.

Figure 3I:
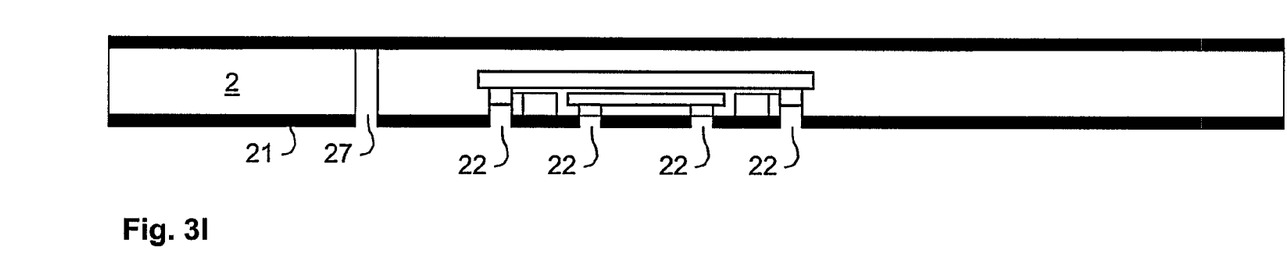

In FIG. 3I, the material that has entered the contact openings 22 during the gluing and lamination is removed. This can be easily done using, for example, a $CO_2$ laser, in such a way that the conductor layer 21 is used as a mask. In that case, the contact openings 22 can be opened into precisely the correct shape and size and in the correct locations, according to the contact openings 22 opened already earlier in the conductor layer 21. At the same time, a through hole 27 penetrating the insulation 2 is made.

Figure 3J:
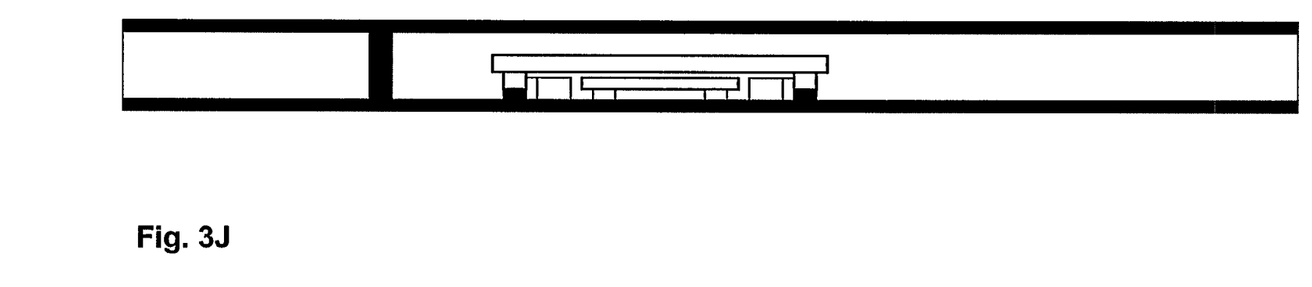
Figure 4:
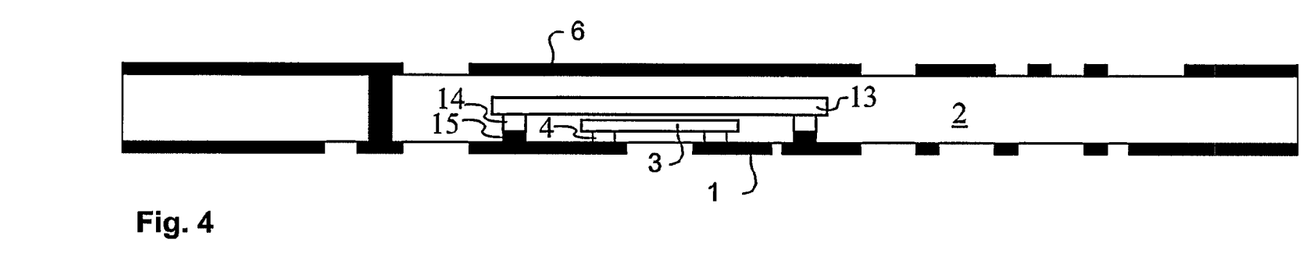
FIG. 4 presents a cross-section of a multi-chip package manufactured using the method of one of FIGS. 3A-3J.

In the next stage, one or more metals are grown on the surfaces of the blank, using first of all at least one chemical growing method and, after that, by increasing the layer thickness using at least one electromechanical growing method, if it is necessary to increase the layer thickness. FIG. 3J shows the blank after this stage. Manufacturing is continued by patterning the conductor layers on the surfaces of the blank, in order to create the conductor surfaces 1 and 6. FIG. 4 presents part of the circuit board or multi-chip package manufactured in this way.

Of course, the method described above can be modified in many ways. The following describes some of such alternative embodiments with reference to FIGS. 5A-5C.

Figure 5A:
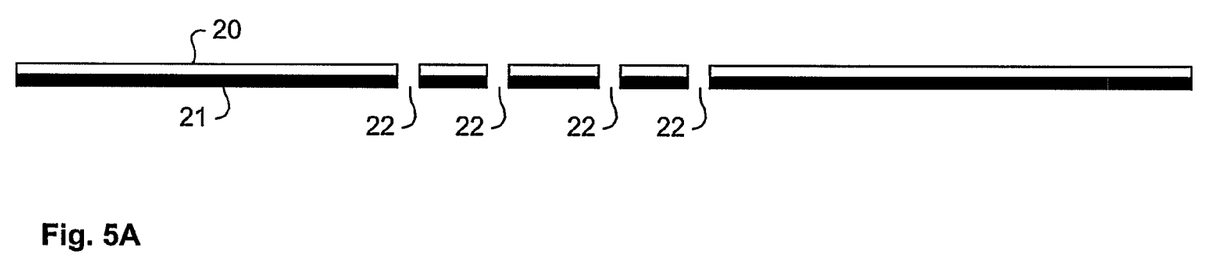
FIGS. 5A-5C present intermediate stages in a manufacturing method according to a second embodiment.

Manufacture in the manner shown in FIG. 5A starts from a blank, in which there is a very thin insulation layer 20 on the surface of the conductor layer 21, which need not be removed from under the first semiconductor chip 3. An insulation layer 20 of this kind can be used, for example, to improve the adhesion between the conductor layer 21 and the adhesive and to ensure that air bubbles that may remain in the adhesive layer do not create poorly insulating channels between the semiconductor chip 3 and the conductor pattern 1. Contact openings 22 are also made in the blank.

Figure 5B:
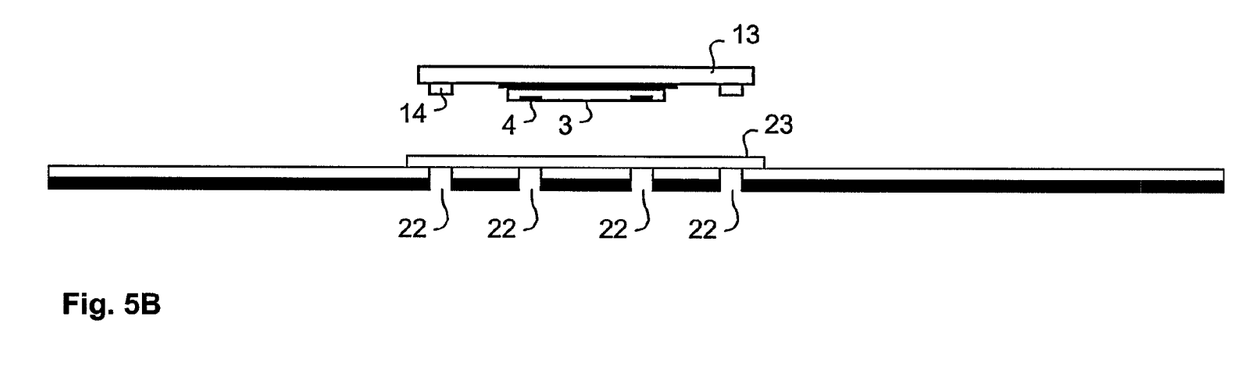

FIG. 5B, for its part, presents an adaptation, in which the first and second semiconductor chips 3, 13 are attached to each other before the semiconductor chips are attached to the blank shown in FIG. 5A with the aid of an adhesive layer 23. The embodiment of FIG. 5B differs from the embodiment described above also in that the first semiconductor chip 3 is bumpless, i.e. the contact terminals are essentially on the plane of the surface of the semiconductor chip 3.

Figure 5C:
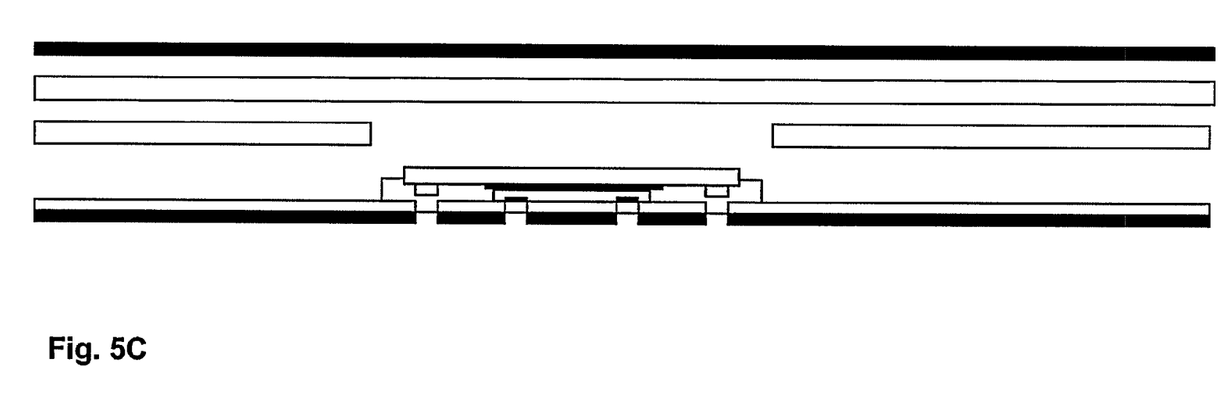
Figure 6:
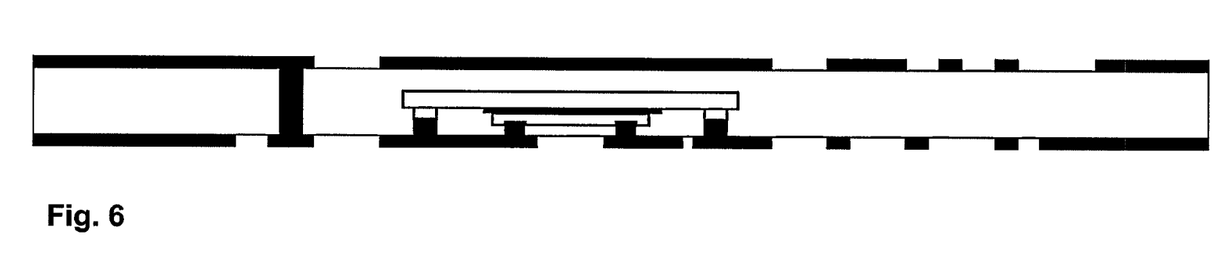
FIG. 6 presents a cross-section of a multi-chip package manufactured using the method of one of FIGS. 5A-5C.

According to FIG. 5C, additional layers are laminated onto the blank shown in FIG. 5B. After this, the method stages described above in connection with FIGS. 3I and 3J are performed and the circuit board or multi-chip package shown in FIG. 6 is made. Of course, the manufacture of the structures shown in FIGS. 4 and 6 can also continue by making additional insulation and conductor layers on the surface of the structure and thus a multi-layer circuit board structure can be manufactured around the multi-chip package.

If the I/O density of the package is high, such additional layers may be necessary in order to make the required vias. In addition to, or instead of the addition of layers, the size of the package can be increased in the width direction. In one embodiment, the first semiconductor chip 3 comprises numerous contact terminals 4 over the surface of the semiconductor chip 3. The second semiconductor chip 13, for its part, contains relatively few contact terminals 14 and these are located close to the edges of the semiconductor chip 13. In such an embodiment, the first semiconductor chip 3 can be, for example, a microprocessor and the second semiconductor chip 13 can be a memory chip.

FIGS. 7A-7I present some possible examples of the lay-outs of multichip packages according to embodiments of the invention. A person skilled in the art can readily contemplate further lay-outs within the scope of the invention. The packages disclosed in FIGS. 7A-7I can be manufactured by means of the embodiments described above, or by their modifications. Also the technical details and parameters disclosed in the above embodiments are applicable, but not limiting, to the embodiments of FIGS. 7A-7I.

The basic principle for placing components of in the embodiments of FIGS. 7A-7I is that top and bottom components overlap each other either wholly or partly. Comparing to previous examples, the first semiconductor chip 3 equals to the bottom component and the second semiconductor chip 13 equals to the top component in the following examples described with reference to FIGS. 7A-7I.

There are advantages for this kind of arrangement. Primarily, module area reduction can be achieved by placing the components wholly or partially on top of each others. According to an embodiment of the invention, the bottom component 3 can be fully located underneath the top component 13 body area. The final module size is limited by the top component 13 body size enabling a true chip scale package. In case such a beneficial positioning cannot be achieved, the top 13 and bottom 3 components may still be placed on top of each in an effective way by overlapping the top and bottom components.

A very powerful overlapping can be achieved by fabricating a redistribution layer on the top component surface. For example, a redistribution layer can be designed on the top component surfaces to guide all signals from their original terminal area locations to one edge or side of the component that is not overlapping with the bottom components 3 and by this way vertically connect the top component 13 signal paths to the conductive layer 21. In other words, the present invention does not have any restrictions for the placing locations of the top components 13 as long as there remains enough surface area on the top component to fabricate vertical interconnections between the top component 13 and conductive layer 21. This enables a lot greater degree of design freedom than with the existing technologies. For example on stacked flip chip solutions the upper die solder balls need to be organized peripherally on each side of the die or to the opposite sides of the die on one or more rows to provide support for the upper component during the assembly and before reflow soldering. In such prior techniques, overlapping is not possible and module embodiments presented on FIGS. 7A-7I cannot be realized.

In addition to the increased package density advantage, by locating top and bottom component closer to each other the signal pathways become shorter, improving the package overall electrical performance. For example, in high speed i.e. high bit-rate applications between a processor and memory components, the distance cannot be long and it should be preferably as short as possible. There has been a major problem in prior art technologies how to locate for example 100-200 pin processor and memory components as near as possible without increasing the area of the package. According to an embodiment of the invention, by overlapping wholly or partly for example a processor and memory components, the aims for short connection distance can be achieved.

Naturally, other than active components can be embedded with the presented multichip packaging technology as well. For example discrete components (resistors, capacitors and inductors) can be included either on top or bottom layers or both layers.

Now back to FIGS. 7A-7I in which: a dash line describes a package outline. Solid lined component with increasing diagonal inner ruling describes a top component. Solid lined component with decreasing diagonal inner ruling describes a bottom component. Solid black areas are the top component's contact areas. Solid gray areas are the bottom component's contact areas. A discrete component is described as a rectangle having in its both ends either solid black or solid gray contact areas, depending on the discrete component's location (top or bottom) in the embodiment.

Figure 7A:
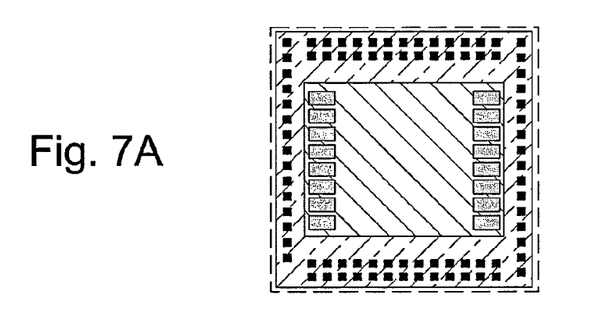
FIGS. 7A-7I present component lay-out examples of multichip packages according to some embodiments of the invention.

FIG. 7A presents an example of a complete stacked package application including two multi-pin components according to an embodiment of the invention.

Figure 7B:
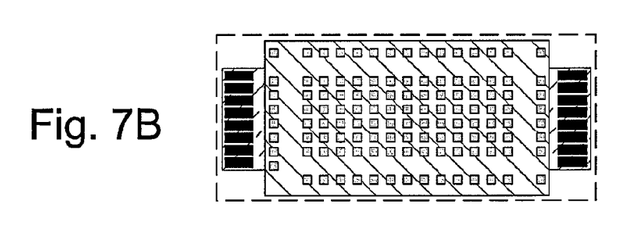

FIG. 7B presents an example of a partly stacked package application including two multi-pin components according to an embodiment of the invention.

Figure 7C:
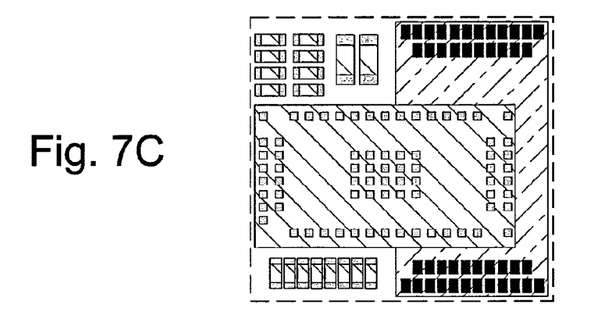

FIG. 7C presents an example of a partly stacked package application including two multi-pin components and discrete components on the bottom component level according to an embodiment of the invention.

Figure 7D:
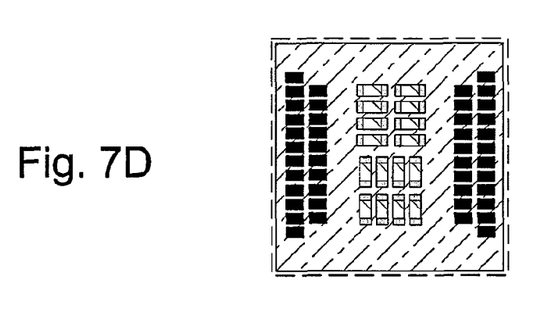

FIG. 7D presents an example of a stacked package application including one multi-pin component on the top component level and discrete components on the bottom component level according to an embodiment of the invention.

Figure 7E:
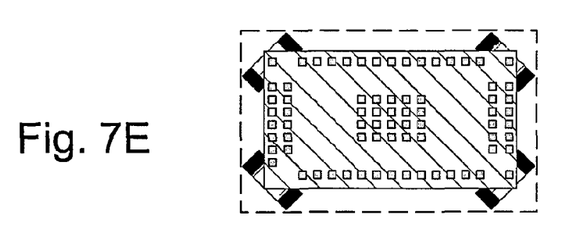

FIG. 7E presents an example of a stacked package application including discrete components on the top component level and one multi-pin component on the bottom component level according to an embodiment of the invention.

Figure 7F:
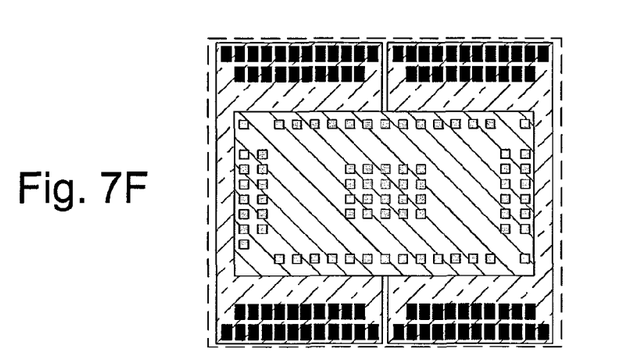

FIG. 7F presents an example of a partly stacked package application including two multi-pin components on the top component level and one multi-pin component on the bottom component level according to an embodiment of the invention.

Figure 7G:
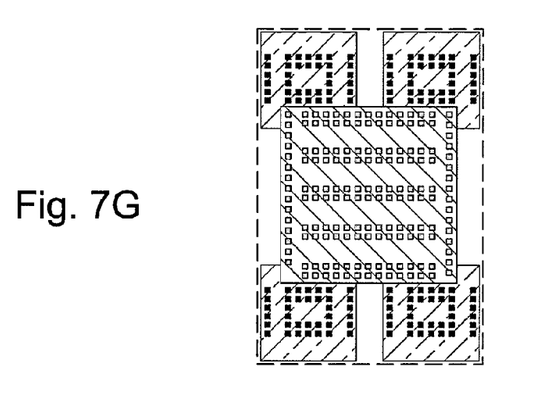

FIG. 7G presents an example of a partly and unsymmetrical stacked package application including four multi-pin components on the top component level and one multi-pin component on the bottom component level according to an embodiment of the invention. The unsymmetrical assembly comes when two components, namely the bottom component is compared to each of top component level component.

Figure 7H:
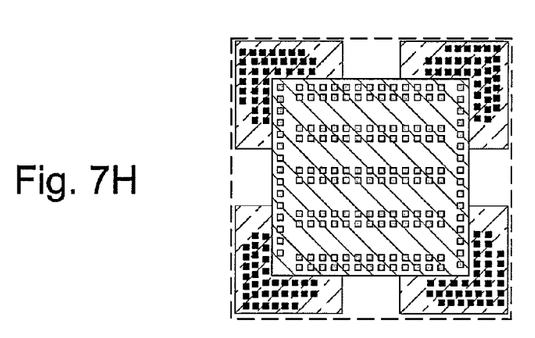

FIG. 7H presents another example of a partly and unsymmetrical stacked package application including four multi-pin components on the top component level and one multi-pin component on the bottom component level according to an embodiment of the invention. The unsymmetrical assembly comes when two components, namely the bottom component is compared to each of top component level component. In this embodiment the top component level components are designed for better redistribution (RDL) capabilities.

Figure 7I:
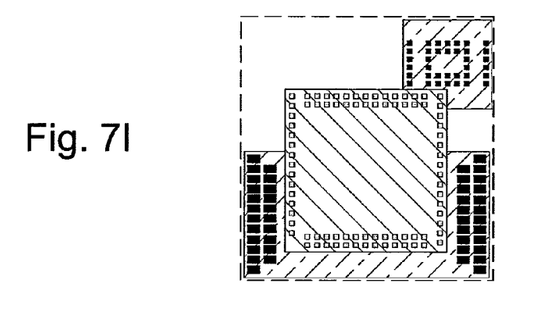

FIG. 7I presents another example of a partly and unsymmetrical stacked package application including three multi-pin components according to an embodiment of the invention.

The examples described above depict some possible processes and products, with the aid of which our invention can be exploited. However, our invention is not restricted to the embodiments described above, but instead the invention covers other different kinds of process too and their end products, to the full extent of the Claims and taking equivalence interpretation into account. The invention is also not restricted to the structures and methods depicted in the examples, but instead it will be obvious to one skilled in the art that different applications of our invention can be used to manufacture very many different kinds of multi-chip packages, electronics modules, and circuit boards, which can even differ greatly from the examples described above. The components and circuit of the figures are thus shown only by way of illustration. Thus, many alterations can be made to the structures and processes of the examples described above, while nevertheless not deviating from the basic idea according to the invention.

The invention claimed is:

1. A multi-chip package, comprising a conductor pattern and insulation, and, inside the insulation
   a first component having contact terminals facing towards the conductor pattern and conductively connected to the conductor pattern; and
   a second component having contact terminals facing towards said conductor pattern and conductively connected to said same conductor pattern, the second component located such that the first component is located at least partly between the second component and the conductor pattern; and
   contact elements each including a metal core, which is metallurgically of the same piece with the conductor pattern such that the metal core joins continuously and without an interface to the material of the conductor pattern;
   wherein:
      the contact elements connect at least said contact terminals of the second component conductively to the conductor pattern,
      the first component and the second component are directly connected to said conductor pattern via the contact elements,
      the first component and the second component are on the same side of the conductor pattern, and
      the first component and the second component are embedded in an insulator layer of the multi-chip package.

2. The multi-chip package of claim 1, wherein the contact elements extend between the contact terminals of the second component and the conductor pattern principally only in the thickness direction of the multi-chip package.

3. The multi-chip package of claim 1, wherein each contact element consists of a cylindrical conductor piece.

4. The multi-chip package of claim 1, wherein also the contact terminals of the first component are connected to said conductor pattern via contact elements including a metal core, which is metallurgically of the same piece with the conductor pattern.

5. The multi-chip package of claim 1, wherein at least one contact terminal of the first component is electrically connected to at least one contact terminal of the second component over a conductor path, which conductor path consists of part of the conductor pattern as well as of a first and second contact element, which are located between the conductor pattern and the first component, as well as corresponding the conductor pattern and the said contact terminals of the second component.

6. The multi-chip package of claim 5, wherein the first contact element consists of a first cylindrical conductor piece and the second contact element consists of a second cylindrical conductor piece.

7. The multi-chip package of claim 3, wherein each cylindrical conductor piece contains a metal core, which is metallurgically of the same piece with the conductor pattern.

8. The multi-chip package of claim 1, wherein at least one contact terminal of the first component is electrically connected to at least one contact terminals of the second component over a conductor path running through the conductor pattern and the contact elements, the length of which conductor path is less than 500 micrometers.

9. The multi-chip package of claim 1, wherein at least one contact terminal of the first component is electrically connected to at least one contact terminals of the second component over a conductor path running through the conductor pattern and the contact elements, the length of which conductor path is less than 250 micrometers.

10. The multi-chip package of claim 1, wherein, in the direction at right angles to the surface of the contact terminals, the contact elements have a height h, which corresponds to the distance between the surface of the contact terminals and the surface of the conductor pattern, as well as a smallest width $w_{min}$ in the direction of the surface of the contact terminals, such that the ratio $$\frac{w_{min}}{h}$$

between the width and the height is at least 0.5 and preferably at least 1.

11. The multi-chip package of claim 1, wherein the heights of the contact elements in a direction at right angles to the surface of the contact terminals are less than 500 micrometers.

12. The multi-chip package of claim 1, wherein the heights of the contact elements in a direction at right angles to the surface of the contact terminals are not greater than 200 micrometers.

13. The multi-chip package of claim 1, wherein the first component is located partly between the second component and the conductor pattern.

14. The multi-chip package of claim 1, wherein the first component is located entirely between the second component and the conductor pattern.

15. The multi-chip package of claim 1, comprising a plurality of first components located at least partly between the second component and the conductor pattern.

16. The multi-chip package of claim 1, comprising a plurality of second components such that the first component is located partly between each of the second components and the conductor pattern.

17. The multi-chip package of claim 1, wherein
the second component has a first zone within which the first component extends between the second component and the conductor pattern;
the second component has a second zone within which the first component does not extend between the second component and the conductor pattern;
the second component comprises at least one contact terminal in the first zone;
the at least one contact terminal in the first zone connects to at least one conductor extending to the second zone; and
at least one of said contact terminals connects to the at least one conductor extending the second zone.

18. The multi-chip package of claim 1, which is a fixed part of a multi-layer circuit board, in such a way that the conductor pattern extends to one of the conductor-pattern layers of the multi-layer circuit board and the insulation is part of at least one of the insulating layers of the multi-layer circuit board.

19. A multi-chip module comprising:
a conductor pattern;
at least one first component electrically connected to the conductor pattern, the at least one first component comprising a surface facing the conductor pattern and contact terminals on the facing surface;
at least one second component electrically connected to the conductor pattern, the at least one second component comprising a surface facing the conductor pattern and contact terminals on the facing surface;
on the facing surface of the at least one second component, a conducting line connected to at least one of the contact terminals on said facing surface;
contact elements made of metal for connecting the at least one second component electrically to the conductor pattern, at least one of the contact elements comprising a first end in contact with the conducting line and a second end in contact with the conductor pattern;
wherein:
the at least one first component at least partly extends between the at least one second component and the conductor pattern,
the first component and the second component are directly connected to said conductor pattern via the contact elements,
the first component and the second component are on the same side of the conductor pattern, and
the first component and the second component are embedded in an insulator layer of the multi-chip module.

* * * * *